(12) United States Patent
Ohta et al.

(10) Patent No.: US 11,073,578 B2
(45) Date of Patent: Jul. 27, 2021

(54) MAGNETIC SENSOR

(71) Applicant: TDK Corporation, Tokyo (JP)

(72) Inventors: Naoki Ohta, Tokyo (JP); Kazuya Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/745,786

(22) Filed: Jan. 17, 2020

(65) Prior Publication Data
US 2020/0292638 A1 Sep. 17, 2020

(30) Foreign Application Priority Data

Mar. 11, 2019 (JP) .............................. JP2019-043975

(51) Int. Cl.
*G01R 33/24* (2006.01)
*G01R 33/038* (2006.01)

(52) U.S. Cl.
CPC ........... *G01R 33/24* (2013.01); *G01R 33/038* (2013.01)

(58) Field of Classification Search
CPC .... G01R 33/24; G01R 33/038; G01R 33/093; G01R 33/091; G01R 33/0005; G01P 1/00
USPC ........................................................ 324/244
See application file for complete search history.

(56) References Cited

U.S. PATENT DOCUMENTS

| | | | | |
|---|---|---|---|---|
| 3,674,946 A * | 7/1972 | Winey | .................... | H04R 9/047 381/408 |
| 5,325,869 A * | 7/1994 | Stokes | ................. | A43B 3/0005 600/592 |
| 5,631,559 A * | 5/1997 | Oliver | .................... | G01B 11/18 324/175 |
| 8,969,101 B1 * | 3/2015 | Wan | ....................... | G01R 33/096 438/3 |
| 9,343,213 B2 * | 5/2016 | Peng | ...................... | H01F 7/0215 |
| 10,718,636 B1 * | 7/2020 | Cox | .................... | G01R 33/0094 |
| 2008/0068008 A1 * | 3/2008 | Watson | ............... | B60R 21/0136 324/228 |
| 2008/0109189 A1 * | 5/2008 | Bauer | ................. | G01R 33/0283 702/189 |
| 2011/0204886 A1 * | 8/2011 | Sasaki | .................... | B82Y 25/00 324/244 |
| 2011/0244599 A1 * | 10/2011 | Whig | .................. | G01R 33/0052 438/3 |
| 2012/0200292 A1 * | 8/2012 | Sugihara | .................. | H01L 43/08 324/252 |
| 2014/0327441 A1 * | 11/2014 | Lauer | ................. | G01R 33/56563 324/318 |
| 2016/0084674 A1 * | 3/2016 | Cambou | ................... | G01B 7/24 324/252 |
| 2018/0062071 A1 * | 3/2018 | Bolognia | ............. | H01L 23/5387 |
| 2020/0300667 A1 * | 9/2020 | Takano | ................. | G01R 33/098 |

FOREIGN PATENT DOCUMENTS

JP   2003-005887 A   1/2003
JP   2018-102995 A   7/2018

* cited by examiner

*Primary Examiner* — Christopher P McAndrew
(74) *Attorney, Agent, or Firm* — Posz Law Group, PLC

(57) ABSTRACT

A magnetic sensor includes a base material, a plurality of magnets provided at predetermined spacing on the base material, and a plurality of magnetic detection parts respectively provided close to the plurality of magnets. Each of the plurality of magnetic detection parts outputs a signal in accordance with change in the magnetic field accompanying deformation of the base material.

10 Claims, 10 Drawing Sheets

MAGNETIC SENSOR

CROSS REFERENCE TO RELATED APPLICATIONS

The present application is based on Japanese Patent Application No. 2019-043975 filed on Mar. 11, 2019, the disclosure of which is incorporated herein by reference.

TECHNICAL FIELD

The present invention relates to a magnetic sensor.

BACKGROUND

A portable information processing device that is called a convertible PC and that can be used in the two modes of a notebook PC mode and a tablet PC mode is known. A convertible PC in general includes a display-side housing on which a touch screen is positioned, a main-body-side housing having a keyboard and a touchpad, and a hinge movably connecting these. By rotating the display-side housing via the hinge roughly 360 degrees about the horizontal axis with respect to the main-body-side housing, notebook PC mode can be switched to tablet mode. When the switch is made to tablet mode from notebook PC mode, the placement surface of the keyboard and touchpad of the main-body-side housing are positioned on the back surface, so that the keyboard and touchpad are exposed to the outside. Consequently, in tablet mode, it is necessary to disable the functions of the keyboard and touchpad in order to prevent erroneous operation of the keyboard and touchpad. In order to enable the functions of the keyboard and touchpad when in notebook PC mode and disable the functions of the keyboard and touchpad when in tablet mode, it is necessary to accurately detect switching between notebook PC mode and tablet mode. Conventionally, a method that detects switching between the two modes using a magnet housed inside one of the display-side housing or the main-body-side housing and a magnetic sensor (magnetic switch) having a magnetic detection element housed inside the other has been used.

Development is progressing on various types of robots that can accomplish work that in the past has been done by workers in place of such workers, such as industrial robots having robot arms and/or the like, and such robots are being introduced at factories and the like that manufacture various types of products. By using various types of robots such as industrial robots that can be taught skills that workers cultivate over many years, stable manufacturing of products over the long term becomes possible. In order for this kind of robot to be taught workers' skills and accomplish work in place of such workers, it is desirable to precisely control the rotational movement and the like of the joints of a robot arm or the like about an axis. In order to precisely control the rotational movement and the like of such joints, conventionally, a magnetic sensor that can detect the rotational angle or the like accompanying such rotational movement has been used.

RELATED LITERATURE

Patent Literature

[PATENT LITERATURE 1] JP Laid-Open Patent Application No. 2018-102995

[PATENT LITERATURE 2] JP Laid-Open Patent Application No. 2003-5887

OVERVIEW OF THE INVENTION

Problem to be Solved by the Invention

In products having a mechanism that rotates about at least one axis, such as the hinge for switching between notebook PC mode and tablet mode in the above-described convertible PC, or joints in robot arms that accomplish rotational movement or the like, new proposals are being sought for sensors that can precisely detect rotation through such mechanisms and that have high convenience.

In consideration of the foregoing, it is an object of the present invention to provide a magnetic sensor that can be used in products having a mechanism for rotating about at least one axis, that can precisely detect rotation through such a mechanism and that has high convenience.

Means for Solving the Problem

In order to resolve the above-described problem, the present invention provides a magnetic sensor including a base material, a plurality of magnets provided at predetermined spacing on the base material, and a plurality of magnetic detection parts respectively provided close to the plurality of magnets. Each of the plurality of magnetic detection parts outputs a signal in accordance with change in the magnetic field accompanying deformation of the base material.

The plurality of magnets may be provided on the base material to be aligned in a first direction within a predetermined plane and to cause mutually different poles of two magnets adjacent in the first direction to be opposite each other, and the magnetic detection parts may be provided close to the respective different poles facing each other of the two adjacent magnets, among the plurality of magnets aligned in the first direction.

The plurality of magnets may have a first magnet group including a plurality of first magnets and a second magnet group including a plurality of second magnets. The plurality of first magnets included in the first magnet group may be provided on the base material aligned in the first direction such that mutually different poles of two adjacent first magnets face each other in the first direction, and the plurality of second magnets included in the second magnet group may be provided on the base material to position the magnetic poles along a second direction that is a direction intersecting the first direction.

The plurality of magnets may further include a third magnet group including a plurality of third magnets. The plurality of third magnets included in the third magnet group may be provided on the base material to position the magnetic poles along the third direction that is a direction intersecting the first direction and the second direction.

The magnetic detection part can include one or a plurality of magnetic detection elements including a magnetization fixed layer in which the magnetization direction is fixed. When including a plurality of the magnetic detection elements, the magnetization direction of the magnetization fixed layer of one of the magnetic detection elements included in the magnetic detection part and the magnetization directions of the magnetization fixed layers of the other magnetization detection elements may be mutually different directions and may be substantially antiparallel.

A plurality of the magnetic detection parts may be provided near each of the facing different poles, respectively, of the two adjacent magnets. The magnetic detection part may include magnetic detection elements that include a magnetization fixed layer in which the magnetization direction is fixed, and the magnetization direction of the magnetization fixed layer of one of the magnetic detection elements included in each of the plurality of magnetic detection parts and the magnetization direction of the magnetization fixed layer of the other magnetic detection elements may be substantially orthogonal to each other.

A TMR element or a GMR element can be used as the magnetic detection element.

EFFICACY OF THE INVENTION

With the present invention, it is possible to provide a magnetic sensor that can be used in products having a mechanism for rotating about at least one axis, that can precisely detect rotation through such a mechanism and that has high convenience.

EMBODIMENT(S) OF THE INVENTION

Figure 1:
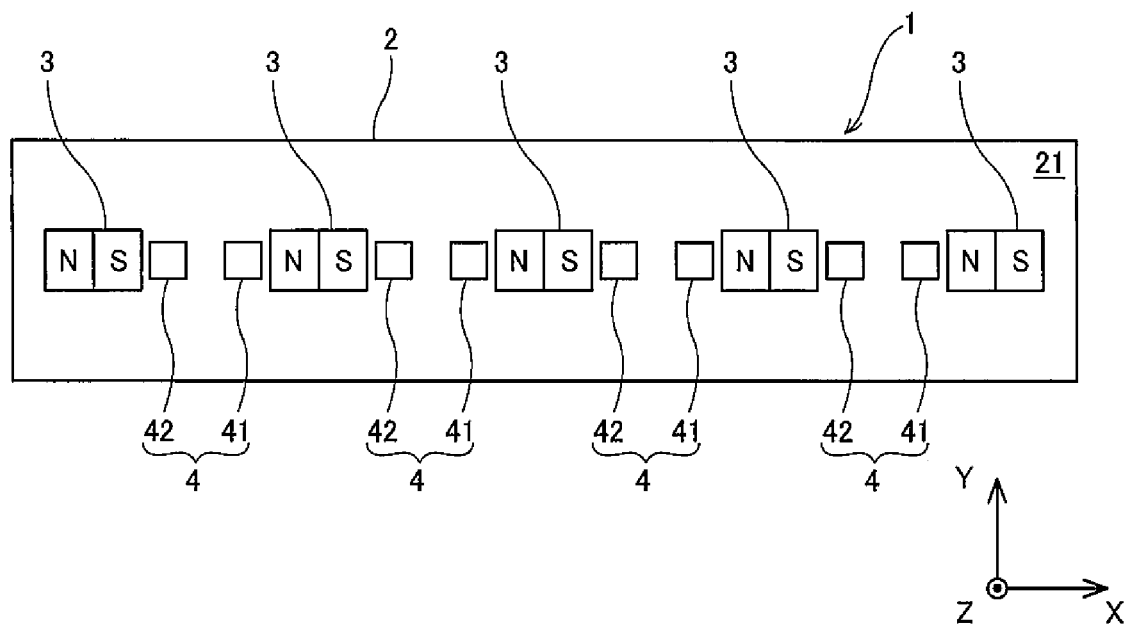
FIG. 1 is a plan view showing the schematic configuration of a magnetic sensor according to an embodiment of the present invention.
Figure 2:
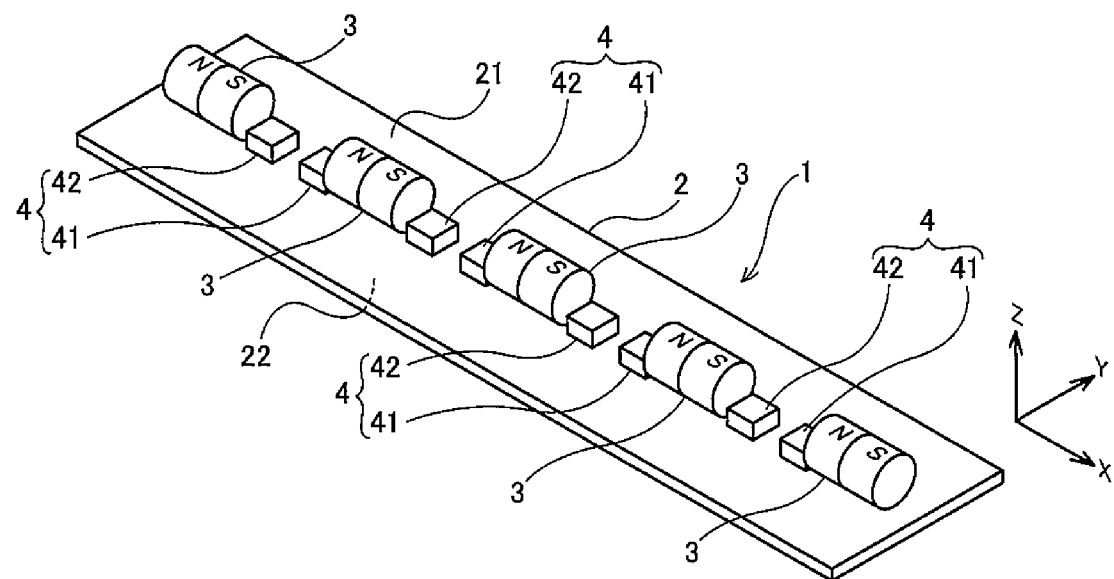
FIG. 2 is a perspective view showing the schematic configuration of a magnetic sensor according to an embodiment of the present invention.

An embodiment of the present invention will be described with reference to the drawings. FIG. 1 is a plan view showing the schematic configuration of a magnetic sensor according to this embodiment, and FIG. 2 is a perspective view showing the schematic configuration of the magnetic sensor according to this embodiment.

In the magnetic sensor according to this embodiment, as needed, the "X-axis direction, Y-axis direction and Z-axis direction" are predetermined in some of the drawings. Here, the X-axis direction and the Y-axis direction are directions orthogonal to each other within a plane substantially parallel to the first surface and second surface of the base material in this embodiment, and the Z-axis direction is the direction of thickness of the base material (a direction orthogonal to the first surface and second surface of the base material).

A magnetic sensor 1 according to this embodiment includes a base material 2 having a first surface 21 and a second surface 22 opposite to the first surface, and a plurality of magnets 3 and a plurality of magnetic detection parts 4 provided on the first surface 21 of the base material 2, and an arithmetic processing part 5 that calculates a physical quantity based on an output signal from each of the magnetic detection parts 4.

The base material 2 may be one that is a flexible base material having flexibility and is capable of mounting the magnets 3 and the magnetic detection parts 4, and for example, a base material made of the following may be cited: polyolefin such as polyethylene terephthalate, polyethylene naphthalate, polyether sulfone, polyimide, nylon, polystyrene, polyvinyl alcohol, ethylene vinyl alcohol copolymer, fluorine resin film, vinyl chloride or polyethylene or the like; an organic material such as cellulose, polyvinylidene chloride, aramid, polyphenylene sulfide, polyurethane, polycarbonate, polyarylate, polynorborene, epoxy resin or the like; a paper material such as paper or synthetic paper or the like; or a compound material such as an insulating material coated or laminated on the surface of a metal foil such as stainless steel, titanium or aluminum or the like. Besides these, the base material 2 is not limited to those as long as it has flexibility and may be a glass material such as quartz or the like, or a metal material such as stainless steel or the like.

In the magnetic sensor 1 according to this embodiment, the base material 2 has a rectangular shape with a first direction (the X-axis direction) being the lengthwise direction (see FIG. 1 and FIG. 2). However, the shape of the base material 2 is not particularly limited and can be appropriately set in accordance with the application or the like of the magnetic sensor 1.

In the magnetic sensor 1 according to this embodiment, the plurality of magnets 3 is arranged at predetermined spacing with the magnetic poles facing the first direction (the X-axis direction) on the first surface 21 of the base material 2 (see FIG. 1). The facing magnetic poles of two of the magnets 3 adjacent in the first direction (the X-axis direction) are poles of mutually differing polarity (N poles and S poles). In this embodiment, the shape of the magnets 3 is roughly cylindrical, but is not limited to this aspect. The shape of the magnets 3 may be a roughly rectangular shape or may be a film shape or sheet shape that is roughly rectangular in the planar view. The spacing, size and the like of the magnets 3 aligned in the first direction (the X-axis direction) is not particularly limited and can be appropriately set in accordance with the application of the magnetic sensor 1 according to this embodiment. In the aspect shown in FIG. 1 and FIG. 2, five magnets 3 are provided on the first surface 21, but the number of magnets 3 is not limited to this. The number of magnets 3 can be appropriately set in accordance with the application of the magnetic sensor 1 and may be at least two.

The plurality of magnetic detection parts 4 is provided near the facing magnetic poles (the N pole of one of the magnets 3 and the S pole of the other magnet 3) of two of the magnets 3 adjacent in the first direction (the X-axis direction). The magnetic detection part 4 includes a first magnetic detection part 41 positioned near the N pole of the magnet 3 and a second magnetic detection part 42 positioned near the S pole of the magnet 3. The first magnetic detection part 41 and the second magnetic detection part 42 output a first sensor signal S1 and a second sensor signal S2, respectively, through a magnetic field (magnetic flux) being applied between the facing magnetic poles (N pole and S pole) of the two adjacent magnets 3 (see FIG. 4). As described below, a sensor signal S indicating the deformation (bend) direction and deformation (bend) amount of the base material 2 is output based on the first sensor signal S1 output from the first magnetic detection part 41 and the second sensor signal S2 output from the second magnetic detection part 42. Accordingly, the first magnetic detection part 41 and the second magnetic detection part 42 are respectively provided near the N pole and S pole of each of the magnets 3 to be capable of outputting the appropriate first sensor signal S1 and second sensor signal S2 in accordance with change in the applied magnetic field accompanying deformation of the base material 2. That is, the first magnetic detection part 41 and the second magnetic detection part 42 are respectively provided at positions capable of outputting the first sensor signal S1 and second sensor signal S2 in order to detect the deformation (bend) direction and deformation (bend) amount of the base material 2 through change in the applied magnetic field. For example, the first magnetic detection part 41 and the second magnetic detection part 42 may be provided at a spacing of 0.1~5.0 mm along the first direction (the X-axis direction) from the N pole and S pole, respectively, of each of the magnets 3, but the spacing between the first magnetic detection part 41 and second magnetic detection part 42 and the magnets 3 (N pole or S pole) may be appropriately set in accordance with the size of the magnets 3 and the strength of the magnetic field and the like. The first sensor signal S1 and the second sensor signal S2 are output to the arithmetic processing part 5 as the sensor signal S via a differential detector 6. Although there is some dependence on the thickness of the base material 2 as well, as long as the magnetic field between the facing poles (N pole and S pole) of two of the magnets 3 can be applied on the magnetic detection parts 4, the magnetic detection parts 4 may be provided on a surface (for example, the second surface 22 of the base material 2) different from the surface on which the magnets 3 are provided (for example, the first surface 21 of the base material 2).

The magnetic detection part 4 (the first magnetic detection part 41 and the second magnetic detection part 42) has a first magnetic detection element part 4A and a second magnetic detection element part 4B. The first magnetic detection element part 4A and the second magnetic detection element part 4B, which the magnetic detection part 4 possesses, may each include at least one magnetic detection element and may have a configuration in which a plurality of magnetic detection elements is connected in series. In this embodiment, the first magnetic detection part 41 and the second magnetic detection part 42 each have a half-bridge circuit that includes a pair of magnetic detection elements connected in series.

Figure 4:
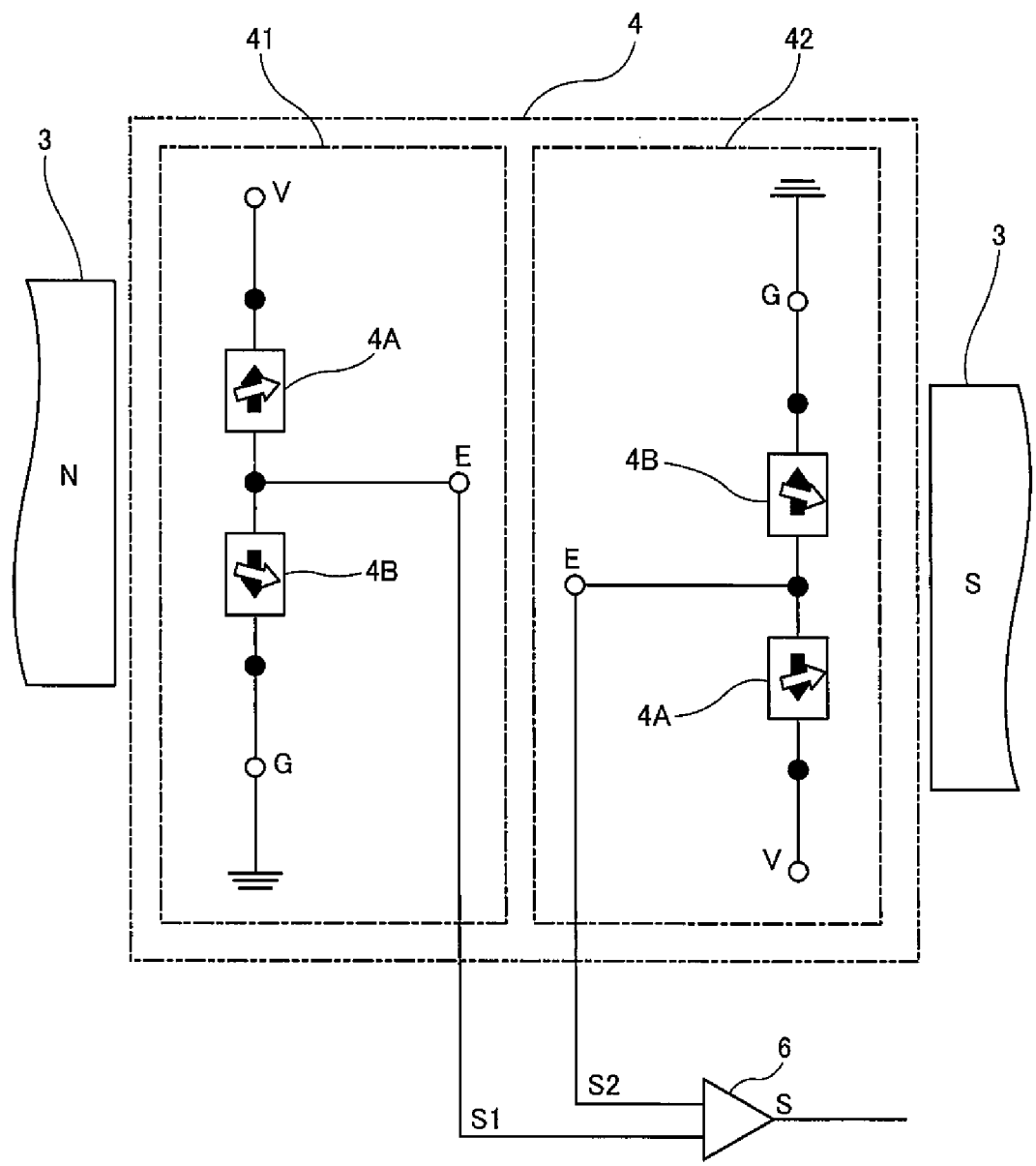
FIG. 4 is a circuit diagram showing the schematic configuration of one aspect of the circuit configuration possessed by the magnetic sensor according to an embodiment of the present invention.

As shown in FIG. 4, the half-bridge circuit, which the first magnetic detection part 41 and the second magnetic detection part 42 have, includes a power source port V, a ground port G, an output port E and the first magnetic detection element part 4A and second magnetic detection element part 4B connected in series. One end of the first magnetic detection element part 4A is connected to the power source port V. The other end of the first magnetic detection element part 4A is connected to one end of the second magnetic detection element part 4B and the output port E. The other end of the second magnetic detection element part 4B is connected to the ground port G. A power source voltage (constant current) of a predetermined magnitude is applied on the power source port V, and the ground port G is connected to ground.

In this embodiment, MR elements such as TMR elements, GMR elements or the like can be used as the magnetic detection elements configuring the first magnetic detection element part 4A and the second magnetic detection element part 4B included in the half-bridge circuit, and using TMR elements is particularly preferable.

Figure 5:
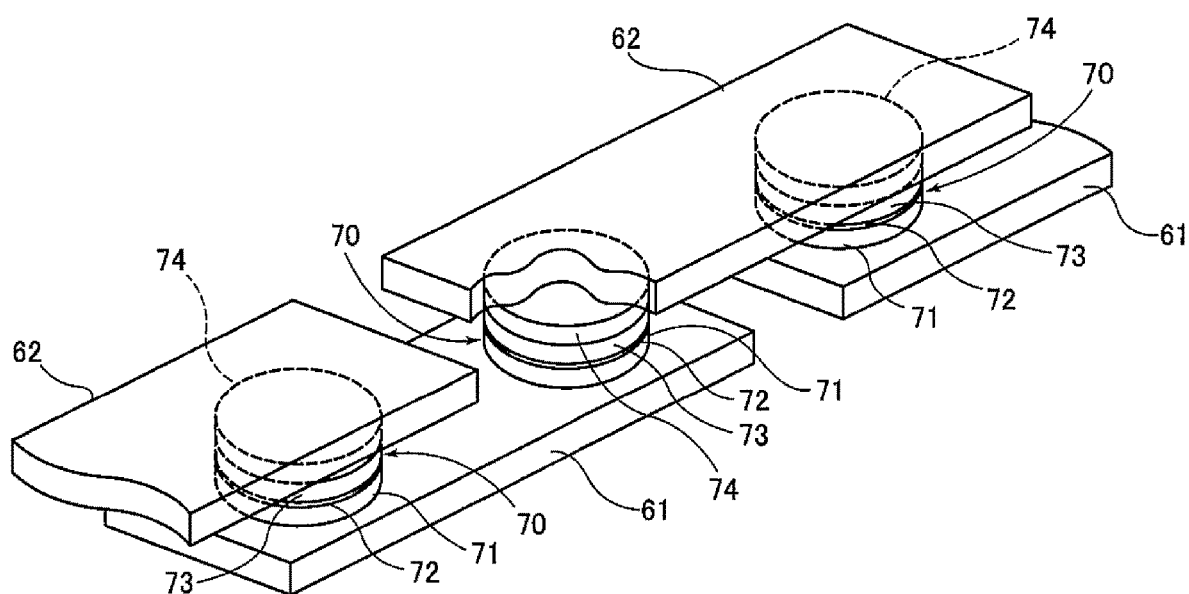
FIG. 5 is a perspective view showing the schematic configuration of a magnetic detection element according to an embodiment of the present invention.

As shown in FIG. 5, the MR element has a plurality of lower electrodes 61, a plurality of MR films 70 and a plurality of upper electrodes 62. The plurality of lower electrodes 61 is provided on a substrate (undepicted). Each of the lower electrodes 61 has a long, narrow shape. A gap is formed between two lower electrodes 61 adjacent in the lengthwise direction of the lower electrodes 61. The MR films 70 are provided on the top surface of the lower electrodes 61, near both ends in the lengthwise direction. The MR film 70 has a roughly circular shape in a plan view and includes a free layer 71, a nonmagnetic layer 72, a magnetization fixed layer 73 and an antiferromagnetic layer 74 layered in this order from the lower electrode 61 side. The free layer 71 is electrically connected to the lower electrode 61. The antiferromagnetic layer 74 is configured by an antiferromagnetic material and serves the role of fixing the direction of magnetization of the magnetization fixed layer 73 by causing exchange coupling with the magnetization fixed layer 73. The plurality of upper electrodes 62 is provided on the plurality of MR films 70. Each of the upper electrodes 62 has a long, narrow shape, is positioned on two of the lower electrodes 61 adjacent in the lengthwise direction of the lower electrodes 61, and electrically connects the antiferromagnetic layers 74 of two adjacent MR films 70. The MR film 70 may have a configuration in which the free layer 71, the nonmagnetic layer 72, the magnetization fixed layer 73 and the antiferromagnetic layer 74 are layered in this order from the upper electrode 62 side. In addition, by having the magnetization fixed layer 73 include a so-called synthetic ferri pinned (SFP) layer with a layered ferri structure of a ferromagnetic layer/nonmagnetic middle layer/ferromagnetic layer and with the two ferromagnetic layers antiferromagnetically coupled, the antiferromagnetic layer 74 may be omitted.

In a TMR element, the nonmagnetic layer 72 is a tunnel barrier layer. In a GMR element, the nonmagnetic layer 72 is a nonmagnetic conductive layer. In a TMR element or GMR element, the resistance value changes in accordance with the angle formed by the direction of magnetization of the free layer 71 with respect to the direction of magnetization of the magnetization fixed layer 73. The resistance value is minimized when this angle is 0° (when the magnetization directions are parallel to each other), and the resistance value is maximized when the angle is 180° (when the magnetization directions are antiparallel to each other).

Figure 6A:
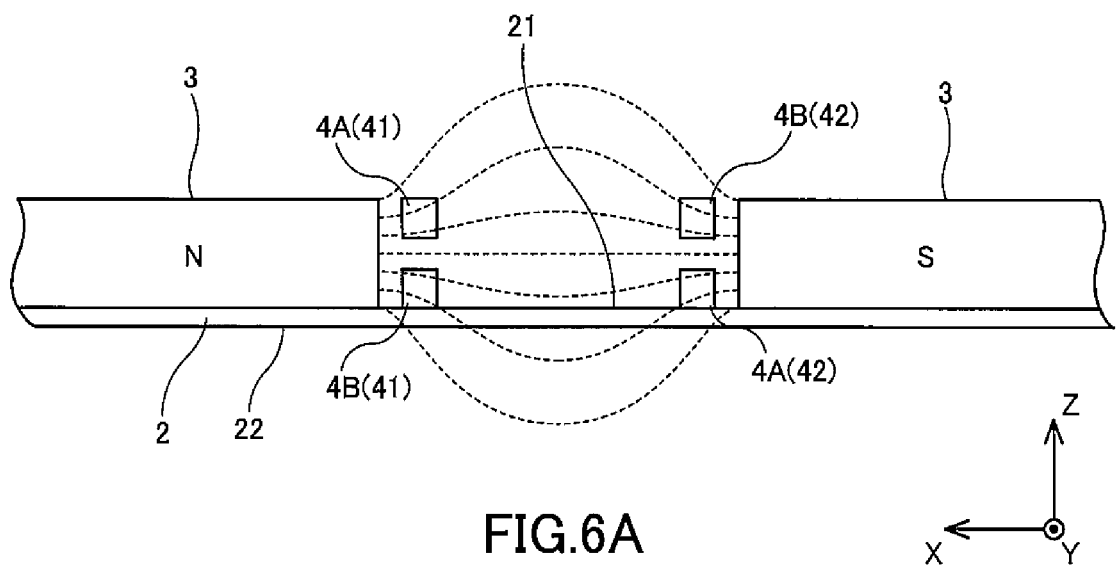
FIG. 6A is a side view conceptually showing the positional relationship between the magnetic detection elements and the magnetic field lines between magnets in the initial state (the state in which the base material is not deformed) of the magnetic sensor according to an embodiment of the present invention.
Figure 6B:
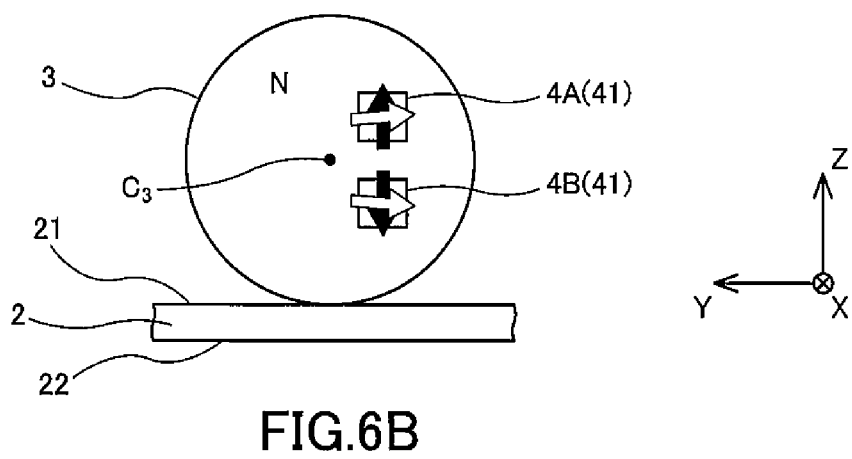
FIG. 6B is a view as viewed from the magnetic detection elements side conceptually showing the N pole of the magnets in FIG. 6A, the positional relationship of the magnetic detection elements close thereto, and the relationship between the magnetization directions of the magnetization free layers and the magnetization fixed layers of the magnetic detection elements.
Figure 6C:
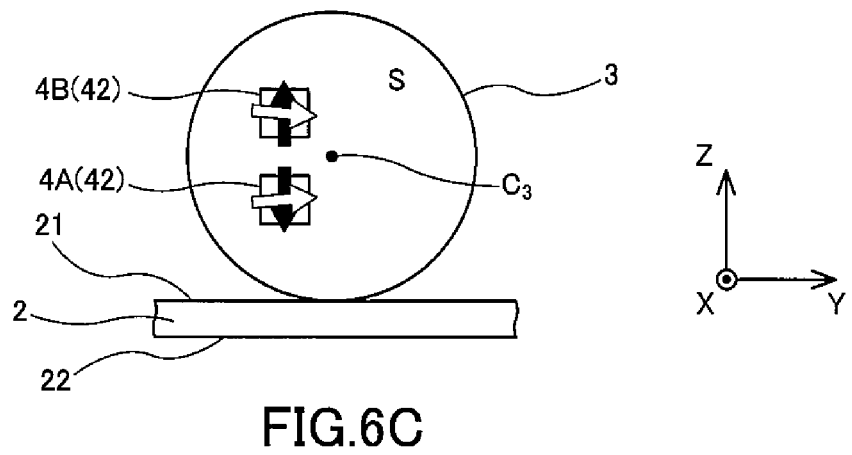
FIG. 6C is a view as viewed from the magnetic detection element side conceptually showing the S pole of the magnets in FIG. 6A, the positional relationship of the magnetic detection elements close thereto, and the relationship between magnetization directions of the magnetization free layers and the magnetization fixed layers of the magnetic detection elements.

In this embodiment, the layering direction in the MR element (the direction from the free layer 71 toward the antiferromagnetic layer 74) is orthogonal to the first surface 21 of the base material 2 (parallel to the first direction (the X-axis direction)), and the magnetization direction of the magnetization fixed layer 73 (the black arrows shown in FIG. 6B and FIG. 6C) is orthogonal to the first direction (the X-axis direction) (parallel to the Z-axis direction). The magnetization direction of the magnetization fixed layer 73 of the magnetic detection element in the first magnetic detection element part 4A and the magnetization direction of the magnetization fixed layer 73 of the magnetic detection element in the second magnetic detection element part 4B are antiparallel to each other. The magnetization direction (the white arrows shown in FIG. 6B and FIG. 6C) of the free layer 71 in the initial state (the state in which the base material 2 is not deformed (bent)) is substantially parallel to the second direction (Y-axis direction) (see FIG. 6B and FIG. 6C). In this embodiment, the first magnetic detection part 41 is provided at a position offset from the geometric center C3 of the magnet 3 (N pole) positioned adjacent thereto (for example, a position offset in the Y-axis direction), when viewed in the X-axis direction from the first magnetic detection part 41 side (see FIG. 6B). The second magnetic detection part 42 is provided at a position offset from the geometric center C3 of the magnet 3 (S pole) positioned adjacent thereto (for example, a position offset in the Y-axis direction), when viewed in the X-axis direction from the second magnetic detection part 42 side (see FIG. 6C). Specifically, the geometric center C3 of the magnet 3 may not be positioned on the line connecting the center of the first magnetic detection element part 4A and the center of the second magnetic detection element part 4B. By having the first magnetic detection part 41 and the second magnetic detection part 42 provided at positions offset from the geometric center C3 of the respective magnets and such that the magnetization direction of the magnetization fixed layer 73 and the free layer 71 is the above-described direction, the first sensor signal S1 and the second sensor signal S2 related to the deformation (bend) direction and deformation (bend) amount of the base material 2 can be output. The dotted lines in FIG. 6A indicate magnetic field lines between the two opposing magnets 3 and 3. The amounts by which the first magnetic detection part 41 and the second magnetic detection part 42 are offset from the geometric center C3 of the magnet 3 may be appropriately set within a range such that the magnetic field generated from the magnets 3 is applied at a desired angle of inclination on the first magnetic detection part 41 and the second magnetic detection part 42 so that the first sensor signal S1 and the second sensor signal S2 related to the deformation (bend) direction and deformation (bend) amount of the base material 2 are output at the desired signal strength. In FIG. 6B and FIG. 6C, the first magnetic detection part 41 and the second magnetic detection part 42 are such that the first magnetic detection element part 4A and the second magnetic detection part element 4B are aligned along the Z-axis direction and are offset in the Y-axis direction, but it is not limited to this. For example, as long as the geometric center C3 of the magnet 3 is not positioned on the line connecting the center of the first magnetic detection element part 4A and the center of the second magnetic detection element part 4B, the offset may be in the Z-axis direction, or the first magnetic detection element part 4A and the second magnetic detection element part 4B may be aligned in the Y-axis direction and may be offset in the Y-axis direction and/or the Z-axis direction.

Figure 7A:
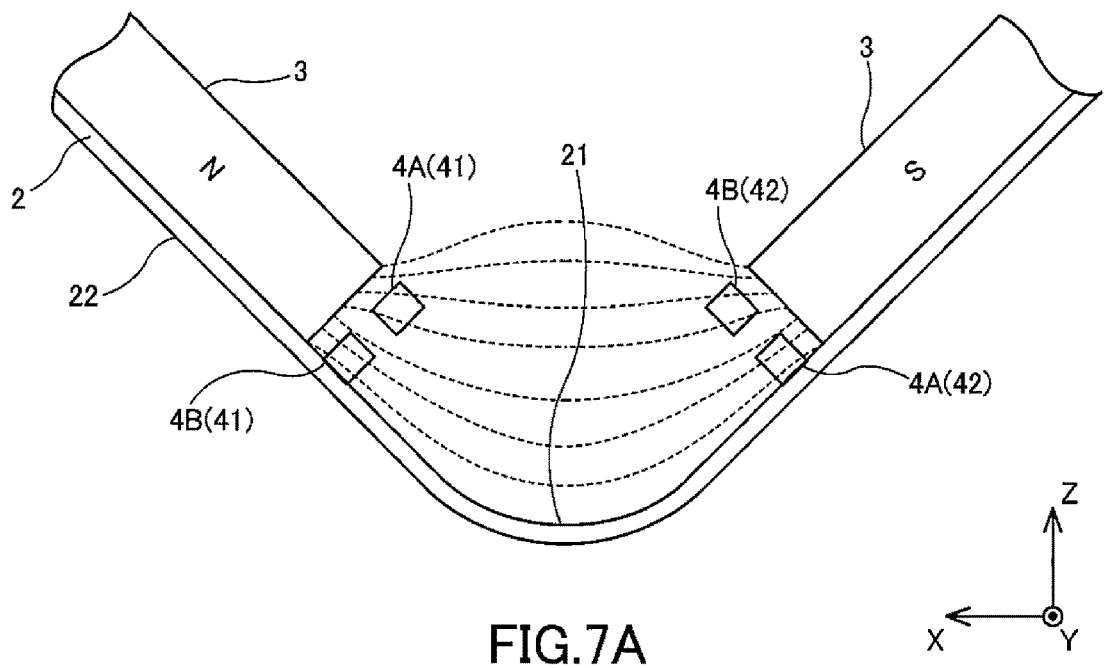
FIG. 7A is a side view conceptually showing the positional relationship between the magnetic detection elements and the magnetic field lines between magnets in a state in which the base material is deformed, in the magnetic sensor according to an embodiment of the present invention.
Figure 7B:
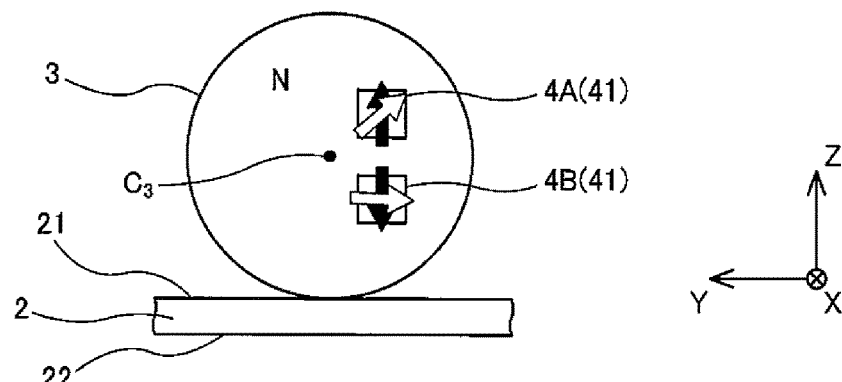
FIG. 7B is a view as viewed from the magnetic detection elements side conceptually showing the N pole of the magnets in FIG. 7A, the positional relationship of the magnetic detection elements close thereto, and the relationship between magnetization directions of the magnetization free layers and the magnetization fixed layers of the magnetic detection elements.
Figure 7C:
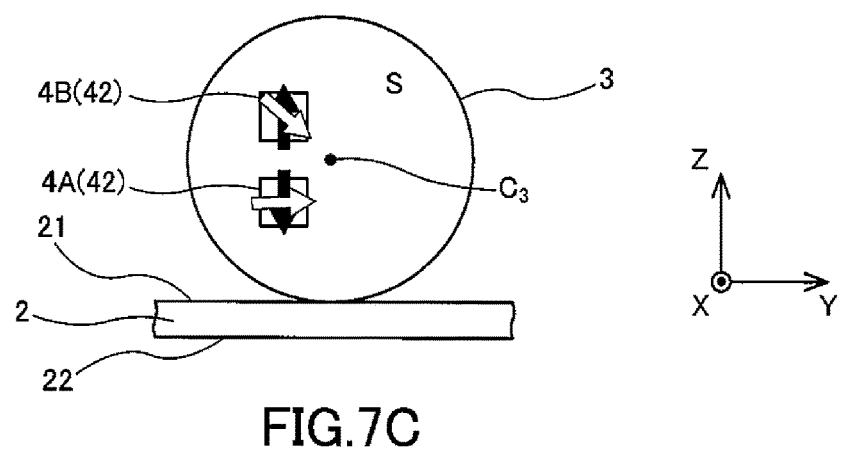
FIG. 7C is a view as viewed from the magnetic detection elements side conceptually showing the S pole of the magnets in FIG. 7A, the positional relationship of the magnetic detection elements close thereto, and the relationship between magnetization directions of the magnetization free layers and the magnetization fixed layers of the magnetic detection elements.

For example, when the first surface 21 of the base material 2 is deformed to bend in a concave shape, in the first magnetic detection part 41, the magnetization direction of the free layer 71 of the first magnetic detection element part 4A (the white arrow shown in FIG. 7B) changes to approach parallel with the magnetization direction of the magnetization fixed layer 73 (the black arrow shown in FIG. 7B), but the magnetization direction of the free layer 71 of the second magnetic detection element part 4B (the white arrow shown in FIG. 7B) substantially does not change so that the resistance value substantially does not change either. On the other hand, in the second magnetic detection part 42, the magnetization direction of the free layer 71 of the first magnetic detection element part 4A (the white arrow shown in FIG. 7C) substantially does not change so that the resistance value substantially does not change either, but the magnetization direction of the free layer 71 of the second magnetic detection element part 4B (the white arrow shown in FIG. 7C) changes to approach antiparallel with the magnetization direction of the magnetization fixed layer 73 (the black arrow shown in FIG. 7C) (see FIG. 7C) so that the resistance value increases. Through this, the first sensor signal S1 and second sensor signal S2 are output as the change in the potential difference of the output ports E. The dotted lines in FIG. 7A indicated the magnetic field lines between the two opposing magnets 3 and 3.

Figure 3:
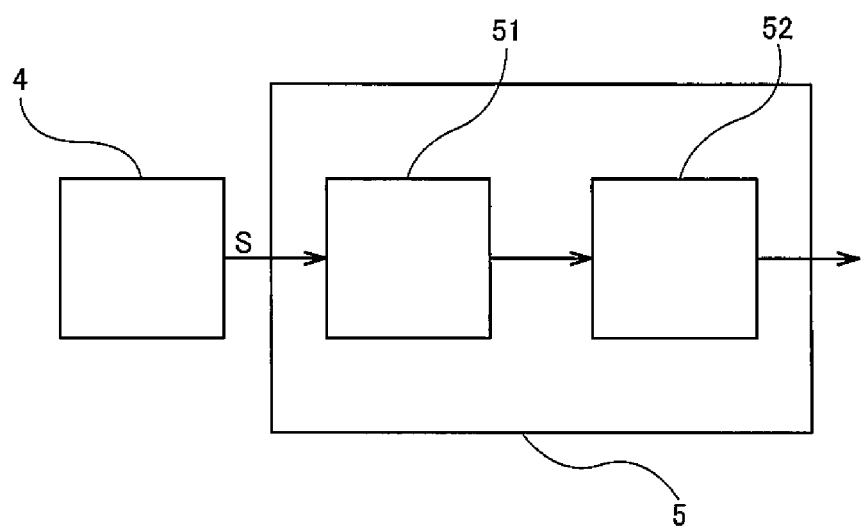
FIG. 3 is a block diagram showing the schematic configuration of a magnetic sensor according to an embodiment of the present invention.

When the second surface 22 of the base material 2 is deformed to bend in a concave shape, in the first magnetic detection part 41, the magnetization direction of the free layer 71 of the second magnetic detection element part 4B changes to approach parallel with the magnetization direction of the magnetization fixed layer 73 so that the resistance value decreases, but the magnetization direction of the free layer 71 of the first magnetic detection element part 4A substantially does not change so that the resistance value substantially does not change either. On the other hand, in the second magnetic detection part 42, the magnetization direction of the free layer 71 of the second magnetic detection element part 4B substantially does not change so that the resistance value substantially does not change either, but the magnetization direction of the free layer 71 of the first magnetic detection element part 4A changes to approach antiparallel with the magnetization direction of the magnetization fixed layer so that the resistance value increases. Through this, the first sensor signal S1 and second sensor signal S2 are output as the change in the potential difference of the output ports E. The differential detector 6 outputs a signal corresponding to the potential difference between the output ports E and E as the sensor signal S to an A/D converter 51 (see FIG. 3) of the arithmetic processing part 5.

The arithmetic processing part 5 includes the A/D (analog-digital) converter 51 that converts the analog signal (sensor signal S) output from the magnetic detection part 4 into a digital signal, and a calculation part 52 that does arithmetic processing of the digital signal converted to digital by the A/D converter 51. As the calculation result from the calculation part 52, a signal related to the deformation (bend) direction and deformation (bend) amount of the base material 2 can be output.

The A/D converter 51 converts the sensor signal S (an analog signal relating to the deformation (bend) direction and deformation (bend) amount of the base material 2) output from the magnetic detection part 4 into a digital signal, and this digital signal is input into the calculation part 52. The calculation part 52 accomplishes arithmetic processing of the digital signal converted from the analog signal by the A/D converter 51. This calculation part 52 is configured by, for example, a microcomputer, an Application Specific Integrated Circuit (ASIC) or the like.

As described above, in this embodiment, when the first surface 21 of the base material 2 is bent and deformed into a concave shape, and when it is bent and deformed into a convex shape (when the second surface 22 is bent and deformed into a concave shape), the direction of the applied magnetic field on the first magnetic detection element part 4A and the direction of the applied magnetic field on the second magnetic detection element part 4B differ. Through this, the sign of the sensor signal S output in accordance with the potential difference between the output ports E differs. Hence, with the magnetic sensor 1 according to this embodiment, it is possible to precisely detect the deformation (bend) direction and deformation (bend) amount of the base material 2.

Accordingly, the magnetic sensor 1 having the above-described configuration can directly detect the deformation (bend) direction and deformation (bend) amount bending between the two magnets 3 adjacent in the base material 2, so for example by being housed in the hinge part of a convertible PC, it is possible to use such for detecting switching between notebook PC mode and tablet mode, and it is possible to increase convenience because it is not necessary to house magnets or a magnetic sensor (magnetic switch) in the housing of the convertible PC. In addition, by lining up at least three of the magnets 3 along the first direction (the X-axis direction), it is possible to detect the deformation (bend) direction and deformation (bend) amount in two or more locations, so the magnetic sensor 1 according to this embodiment can be appropriately used in shape control in industrial robots or snake robots having a robot arm or the like that bends and deforms in two or more locations.

The above-described embodiment was described to facilitate understanding of the present invention, but is not described to limited to the present invention. Accordingly, all components disclosed in the above-described embodiment shall be construed to include all design modifications or equivalents falling within the technical scope of the present invention.

In the above-described embodiment, the embodiment in which a plurality of magnets 3 and a plurality of magnetic detection parts 4 were provided on the first surface 21 of a base material 2 having flexibility has been descried as an example, but is not limited to this embodiment. The base material 2 on which the magnet 3 and magnetic detection part 4 are provided may be a member of a product with which the magnet 3 and magnetic detection part 4 are equipped. For example, in a convertible PC, the magnets 3 and magnetic detection part 4 may be provided on both the display-side housing (housing having the display) and the main-body-side housing (housing having the keyboard and touchpad) to face each other with the hinge or the like interposed in between, and the display-side housing and main-body-side housing in this case can be conceptualized as the base material 2 in the above-described embodiment. In this case, the magnets 3 and the magnetic detection parts 4 may be provided on the display-side housing and the main-body-side housing in a state mounted on a rigid substrate (silicon substrate or the like), for example. In addition, in a robot arm in which a first arm section and a second arm section are movably connected via a joint section, the magnets 3 and the magnetic detection parts 4 may be provided in both the first arm section and the second arm section to face each other with the joint section interposed in between, and the first arm section and the second arm section in this case can be conceptualized as the base material 2 in the above-described embodiment. In this case, the magnets 3 and the magnetic detection parts 4 may be provided in the first arm section and the second arm section in a state mounted on a rigid substrate (a silicon substrate or the like), for example.

In the above-described embodiment, the embodiments in which a plurality of magnets 3 and a plurality of magnetic detection parts 4 are provided aligned in a first direction (the X-axis direction) on the first surface 21 of a base material 2 having flexibility and deformation occurred by bending in a direction (the Y-axis direction) orthogonal to the first direction (X-axis direction) as an axis (see FIG. 6A and FIG. 7A) has been described as an example, but is not limited to this embodiment. For example, the plurality of magnets 3 and the plurality of magnetic detection parts 4 may be provided aligned within a tubular base material 2 having flexibility, or the plurality of magnets 3 and the plurality of magnetic detection parts 4 may be housed to be aligned on a columnar base material 2 having flexibility.

In the above-described embodiment, the embodiment in which the plurality of magnets 3 is aligned along the first direction (the X-axis direction) on the first surface 21 of the base material 2 has been described as an example, but is not limited to this embodiment. For example, the plurality of magnets 3 and the plurality of magnetic detection parts 4 may also be provided on the second surface 22 of the base material 2.

Figure 8:
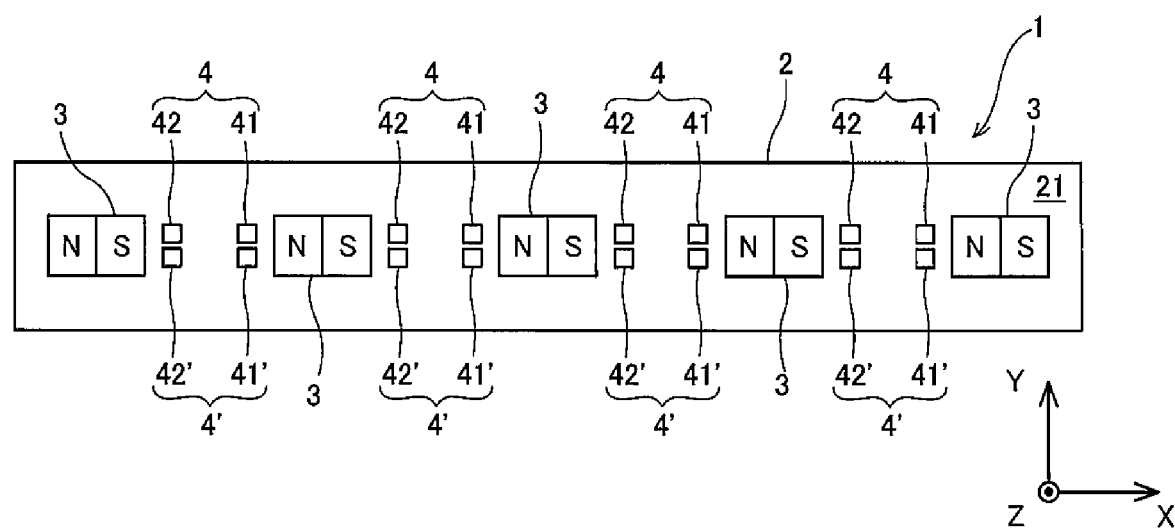
FIG. 8 is a plan view showing the schematic configuration of another aspect (the first) of the magnetic sensor according to an embodiment of the present invention.
Figure 9:
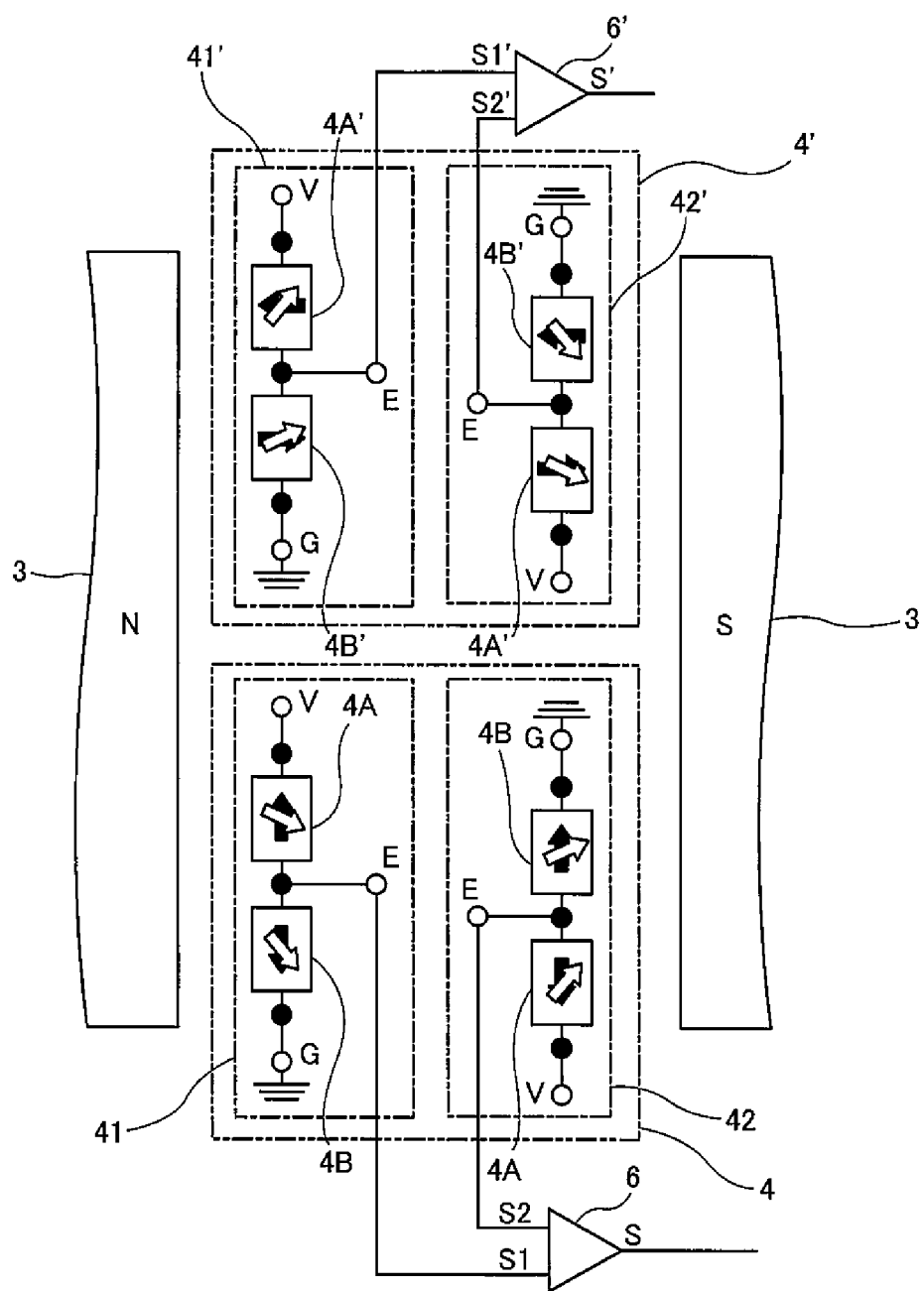
FIG. 9 is a circuit diagram showing the schematic configuration of one aspect of the circuit configuration possessed by the magnetic sensor of the aspect shown in FIG. 8.

In the above-described embodiment, the embodiments in which one magnetic detection part 4 is provided near the magnetic pole (N pole or S pole) of each of the magnets 3 has been described as an example, but is not limited to this embodiment. For example, as shown in FIG. 8, two of the first magnetic detection parts 41 and 41' may be provided to line up in the Y-axis direction near the N pole of each of the magnets 3, and two of the second magnetic detection parts 42 and 42' may be provided to line up in the Y-axis direction near the S pole. In this configuration, as shown in FIG. 9, the magnetization direction (black arrow shown in FIG. 9) of the magnetization fixed layer 73 of the first magnetic detection element part 4A and second magnetic detection element part 4B in one of the first magnetic detection parts 41 provided near the N pole of each of the magnets 3 and the magnetization direction (black arrow shown in FIG. 9) of the magnetization fixed layer 73 of the first magnetic detection element part 4A and second magnetization detection element part 4B in the other of the first magnetic detection parts 41' are preferably orthogonal. In addition, the magnetization direction (black arrow shown in FIG. 9) of the magnetization fixed layer 73 of the first magnetic detection element part 4A and second magnetic detection element part 4B in one of the second magnetic detection parts 42 provided near the S pole of each of the magnets 3 and the magnetization direction (black arrow shown in FIG. 9) of the magnetization fixed layer 73 of the first magnetic detection element part 4A and second magnetization detection element part 4B in the other of the second magnetic detection parts 42' are preferably orthogonal. Through this, for example in the mechanism for rotating about one of the two orthogonal rotational axis (for example, the rotational mechanism in the up-down direction centered on a rotational axis in the horizontal direction such as a shoulder joint section in the robot arm of a humanoid robot and the rotational mechanism in the front-back direction centered on a rotational axis in a direction orthogonal thereto), it is possible to detect the rotation direction and rotation amount (rotational angle) centered on one of the rotational axes based a sensor signal S output from the differential detector 6 as a signal corresponding to the potential difference (first sensor signal S1 and second sensor signal S2) between the output ports E and E of the first magnetic detection part 41 and the second magnetic detection element part 42. In addition, it is possible to detect the rotation direction and rotation amount (rotational angle) centered on the other of the rotational axes based on the sensor signal S' output form the differential detector 6' as a signal corresponding to the potential difference (first sensor signal S1' and second sensor signal S2') between the output ports E and E of the first magnetic detection part 41' and the second magnetic detection element part 42'.

In addition, two of the first magnetic detection parts 41 and 41' may be aligned in the X-axis direction near the N pole of each of the magnets 3, and two of the second magnetic detection parts 42 and 42' may be aligned in the X-axis direction near the S pole. In this case, in this configuration, the magnetization direction of the magnetization fixed layers 73 of the first magnetic detection element part 4A and the second magnetic detection element part 4B in one of the first magnetic detection parts 41 provided near the N pole of each of the magnets 3 and the magnetization direction of the magnetization fixed layer 73 of the first magnetic detection element part 4A and the second magnetic detection element part 4B in the other of the first magnetic detection parts 41' may be parallel, and the magnetization direction of the magnetization fixed layers 73 of the first magnetic detection element part 4A and the second magnetic detection element part 4B in one of the second magnetic detection parts 42 provided near the S pole of each of the magnets 3 and the magnetization direction of the magnetization fixed layer 73 of the first magnetic detection element part 4A and the second magnetic detection element part 4B in the other of the second magnetic detection parts 42' may be parallel. Through this, it is possible to increase the signal strength of the sensor signal.

In the above-described embodiment, the embodiment in which the plurality of magnets 3 is aligned in the first direction (the X-axis direction) on the first surface 21 of the base material 2 has been described as an example, but is not limited to this embodiment. For example, the plurality of magnets 3 may include a first magnet group aligned in the first direction (the X-axis direction) and a second magnet group aligned in a second direction that is a direction intersecting the first direction (the X-axis direction), and the plurality of magnets included in the second magnetic group may be provided on the first surface so as to position the magnetic poles (N pole and S pole) in the second direction.

Figure 10:
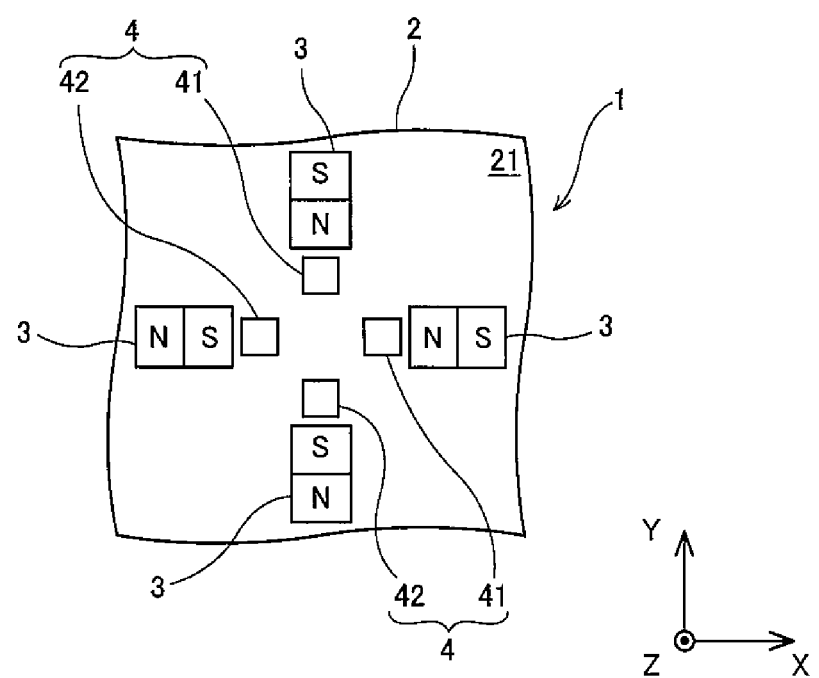
FIG. 10 is a plan view showing the schematic configuration of another aspect (the second) of the magnetic sensor according to an embodiment of the present invention.

More specifically, as shown in FIG. 10, the magnetic sensor 1 may be provided with a first magnet group including a plurality of magnets 3 (for example, two magnets 3) aligned in the first direction (the X-axis direction) on the first surface 21 of the base material 2, a second magnet group including a plurality of magnets 3 (for example, two magnets 3) aligned in the second direction (the Y-axis direction) orthogonal to the first direction (the X-axis direction) on the first surface 21, and the magnetic detection part 4 positioned near the poles of each of the magnets 3 included in the first magnet group and the second magnet group. In addition, a third magnet group including a plurality of magnets 3 (for example, two magnets 3) aligned in a third direction (the Z-axis direction) and a magnetic detection part positioned near the poles of each of the magnets 3 included in the third magnet group may be further provided. With the configuration shown in FIG. 10, it is possible to detect the deformation (bend) direction and the deformation (bend) amount) with the first direction (the X-axis direction) and the second direction (the Y-axis direction) as the axes.

Figure 11:
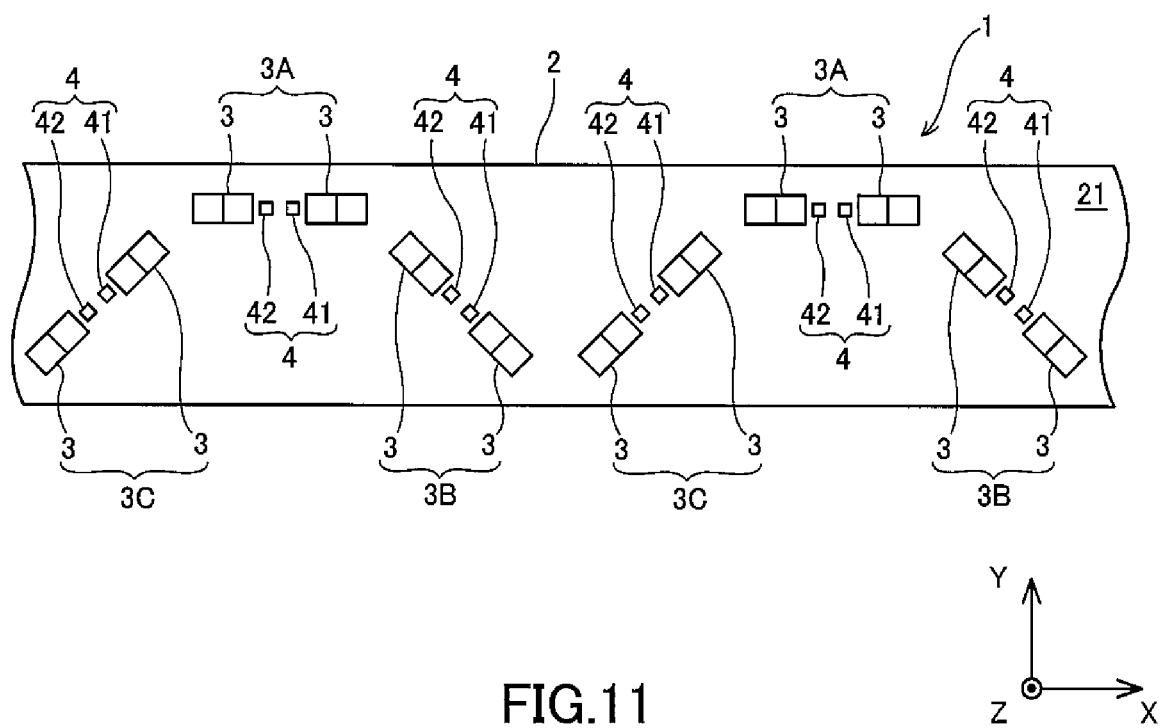
FIG. 11 is a plan view showing the schematic configuration of another aspect (the third) of the magnetic sensor according to an embodiment of the present invention.

In addition, as shown in FIG. 11, the magnetic sensor 1 may include a first magnet group 3A including a plurality of magnets 3 aligned in a first direction (the X-axis direction) on the first surface 21 of the base material 2, a second magnet group 3B including a plurality of magnets 3 aligned in a second direction that intersects the first direction obliquely at an angle of substantially 45 degrees (in the range of 45 degrees±15 degrees) on the first surface 21, a third magnet group 3C including a plurality of magnets 3 aligned in a third direction substantially orthogonal (in the range of 90 degrees±30 degrees) to the second direction on the first surface 21, and a magnetic detection part 4 (first magnetic detection part 41 and second magnetic detection part 42) positioned near the magnetic poles of each of the magnets 3 included in the first through third magnet groups.

With the configuration shown in FIG. 11, it is possible to detect the deformation (bend) direction and deformation (bend) amount with the Y-axis direction orthogonal to the first direction (the X-axis direction) as the axis through the magnetic detection part 4 positioned near the magnets 3 of the first magnetic group 3A, and it is also possible to detect the twist deformation direction and twist deformation amount with the first direction (the X-axis direction) as the axis through the magnetic detection part 4 positioned near the magnets 3 of the second magnet group 3B and the magnetic detection part 4 positioned near the magnets 3 of the third magnet group 3C. Accordingly, it is possible, for example, to detect the rotation direction and rotation amount (rotational angle) in a rotation mechanism centered on a rotation axis in one direction (a direction orthogonal to the first direction (the X-axis direction)) such as an elbow joint in a robot arm of a humanoid robot, along with the twist direction and twist amount in a twist mechanism with a direction orthogonal thereto (the first direction (the X-axis direction)) as the axis.

DESCRIPTION OF SYMBOLS

1 Magnetic sensor
2 Base material

21 First surface
22 Second surface
3 Magnet
4 Magnetic detection part

The invention claimed is:

1. A magnetic sensor comprising:
   a base material;
   a plurality of magnets provided at predetermined spacing on the base material; and
   a plurality of magnetic detection parts respectively provided close to the plurality of magnets;
   wherein each of the plurality of magnetic detection parts outputs a signal in accordance with change in the magnetic field accompanying deformation of the base material;
   the plurality of magnets is provided on the base material to be aligned in a first direction within a predetermined plane and to cause mutually different poles of two magnets adjacent in the first direction to be opposite each other; and
   the magnetic detection parts are provided close to the respective different poles facing each other of the two adjacent magnets, out of the plurality of magnets aligned in the first direction.

2. The magnetic sensor according to claim 1 wherein:
   the plurality of magnets has a first magnet group including a plurality of first magnets and a second magnet group including a plurality of second magnets;
   the plurality of first magnets included in the first magnet group is aligned on the base material in the first direction such that mutually different poles of two adjacent first magnets face each other in the first direction; and
   the plurality of second magnets included in the second magnet group is provided on the base material to position magnetic poles along a second direction that is a direction intersecting the first direction.

3. The magnetic sensor according to claim 2, wherein the plurality of magnets further comprises a third magnet group including a plurality of third magnets; and
   the plurality of third magnets included in the third magnet group are provided on the base material to position the magnetic poles along the third direction that is a direction intersecting the first direction and the second direction.

4. The magnetic sensor according to claim 1, wherein a plurality of the magnetic detection parts is provided near the facing different poles, respectively, of the two adjacent magnets.

5. The magnetic sensor according to claim 1, wherein the magnetic detection part includes magnetic detection elements that include a magnetization fixed layer in which the magnetization direction is fixed.

6. The magnetic sensor according to claim 5, wherein
   the magnetic detection part includes a plurality of the magnetic detection elements; and
   the magnetization direction of the magnetization fixed layer of one of the magnetic detection elements included in the magnetic detection part and the magnetization direction of the magnetization fixed layer of the other magnetic detection element are mutually differing directions.

7. The magnetic sensor according to claim 6, wherein the magnetization direction of the magnetization fixed layer of one of the magnetic detection elements included in the magnetic detection part and the magnetization direction of the magnetization fixed layer of the other magnetic detection elements are substantially antiparallel.

8. The magnetic sensor according to claim 4, wherein:
   the magnetic detection part includes a magnetic detection element including a magnetization fixed layer in which the magnetization direction is fixed; and
   the magnetization direction of the magnetization fixed layer of one of the magnetic detection elements included in each of the plurality of magnetic detection parts and the magnetization direction of the magnetization fixed layer of the other magnetic detection elements intersect each other.

9. The magnetic sensor according to claim 8, wherein the magnetization direction of the magnetization fixed layer of one of the magnetic detection elements included in each of the plurality of magnetic detection parts and the magnetization direction of the magnetization fixed layer of the other magnetic detection elements are substantially orthogonal to each other.

10. The magnetic sensor according to claim 5, wherein the magnetic detection element is a TMR element or a GMR element.

* * * * *